United States Patent [19]

Lindsay

[11] Patent Number: 5,010,295
[45] Date of Patent: Apr. 23, 1991

[54] BALL SCREW SUPPORTED Z STAGE

[75] Inventor: William B. Lindsay, Mountain View, Calif.

[73] Assignee: General Signal Corporation, Stamford, Conn.

[21] Appl. No.: 365,878

[22] Filed: Jun. 14, 1989

[51] Int. Cl.[5] .......................... G01R 1/02; G01R 1/04
[52] U.S. Cl. ........................... 324/158 R; 324/158 P; 269/21; 279/3; 74/529
[58] Field of Search .................. 269/21; 279/3; 324/158 F, 158 P, 73 PC; 74/527

[56] References Cited

U.S. PATENT DOCUMENTS

| | | |
|---|---|---|
| 3,050,617 | 8/1962 | Lasch . |
| 3,437,929 | 4/1969 | Glenn . |
| 3,499,640 | 3/1970 | Berz . |
| 3,499,714 | 3/1970 | Schellenberg . |
| 3,628,120 | 12/1971 | Frederiksen . |
| 3,689,892 | 9/1972 | Glenn et al. . |
| 3,851,249 | 11/1974 | Roch . |
| 3,936,743 | 2/1976 | Roch ........................ 269/55 |
| 4,030,527 | 6/1977 | Roch . |
| 4,056,777 | 11/1977 | Roch . |
| 4,066,943 | 1/1978 | Roch . |
| 4,425,037 | 1/1984 | Hershel et al. . |
| 4,448,403 | 5/1984 | Riessland et al. .............. 269/21 |
| 4,530,635 | 7/1985 | Engelbrecht et al. ............ 269/21 |
| 4,542,298 | 9/1985 | Holden ..................... 250/440.1 |
| 4,560,880 | 12/1985 | Petric et al. ................ 250/441.1 |
| 4,567,938 | 2/1986 | Turner ..................... 250/492.3 |
| 4,607,525 | 8/1986 | Turner et al. . |
| 4,818,169 | 4/1989 | Schram et al. . |

Primary Examiner—Kenneth Wieder
Assistant Examiner—William J. Burns
Attorney, Agent, or Firm—Flehr, Hohbach, Test, Albritton & Herbert

[57] ABSTRACT

A ball screw supported Z stage for use in a wafer prober is disclosed. The present invention provides the capability of precisely positioning and rigidly supporting a work surface in a low profile package.

9 Claims, 5 Drawing Sheets

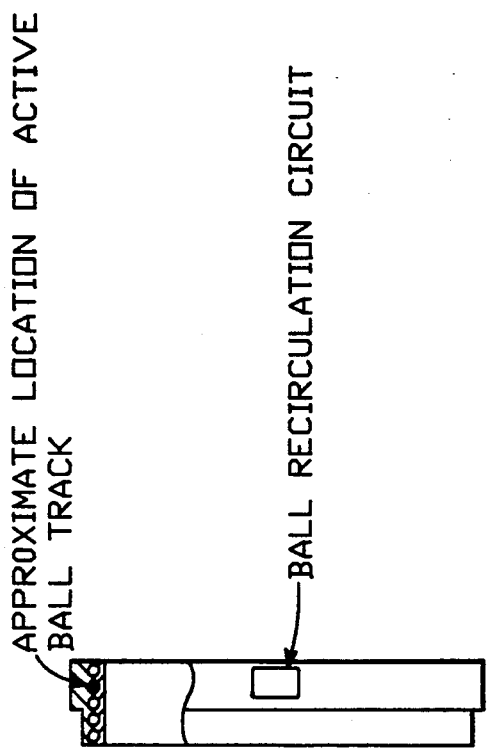
FIG.—5B
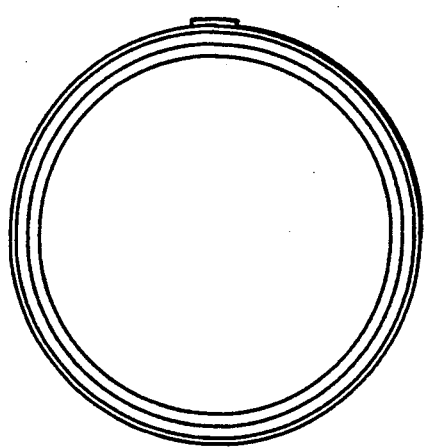
FIG.—5A

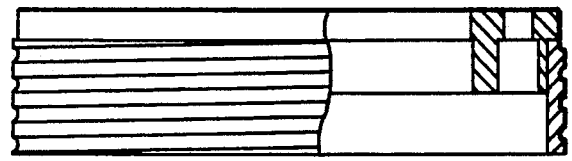
FIG.—7B
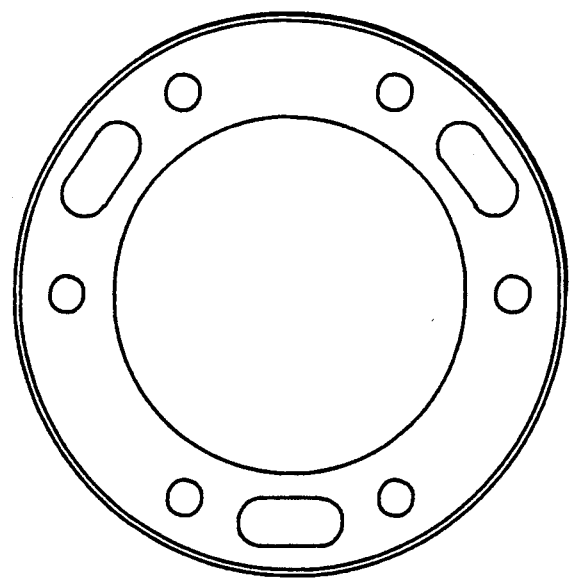
FIG.—7A

BALL SCREW SUPPORTED Z STAGE

BACKGROUND OF THE INVENTION

The present invention relates to a ball screw Z stage for use in wafer probers.

The use of a ball screw is a common practice for moving a load along a constrained axis. Constraining the other axes is normally accomplished by conventional bearings.

In prior art approaches in wafer prober technology, to obtain adequate cross axis torsional stiffness with a conventional bearing-based stage requires a relatively long (or tall in the case of a Z stage) constraint. One particular approach utilizes long journal bearings to support the Z stage. This construction technique at least doubles the working plane height. The result of the taller Z stage is increased XY positioning errors, such as due to dynamic effects.

It would be desirable to provide an improved Z stage support which overcomes such deficiencies in prior art approaches.

SUMMARY OF THE INVENTION

It is an object of the present invention to provide a ball screw supported Z stage for use, in particular, in wafer probers.

In accordance with one embodiment of the present invention, the ball screw supported Z stage supports a preload and external load about a large diameter foot print, and thus achieves high cross axis torsional stiffness. All of the load is transmitted directly through high contact angled ball bearings in compression. The only resultant deflection due to bending effects is within the work surface or vacuum chuck. The minimum actual height required is only a function of the required travel and ball size. Very little extra height is required to implement the present invention.

Other objects, features and advantages of the present invention will become apparent from the following detailed description when taken in conjunction with the accompanying drawings.

BRIEF DESCRIPTION OF THE DRAWINGS

FIG. 1 depicts a cross-sectional block diagram or a ball screw supported Z stage according to the present invention.

FIG. 2 depicts another cross-sectional view of the ball supported Z stage of FIG. 1.

FIG. 3 depicts diagram of initialization of a retainer which forms a portion of FIG. 1.

FIG. 4 depicts a cross-sectional view of the initialization of the ball supported Z stage of FIG. 1.

FIGS. 5A and 5B depict cross-sectional and side views of a ball screw which forms a portion of FIG. 1.

FIGS. 6A and 6B depict side view and cross-sectional views of an outer race which forms a portion of FIG. 1.

FIGS. 7A and 7B depict cross-sectional and side views of an inner race which forms a portion of FIG. 1.

DETAILED DESCRIPTION OF THE DRAWINGS

One purpose of the present invention is to be able to precisely move a chuck top 1 up and down with respect to a base 2 in the Z axis, while maintaining high torsional stiffness about the X and Y axes. This is accomplished by supporting the chuck top 1 with a hollow ball screw consisting of the outer and inner race 3 and 4 with matching helical grooves, one or more spiral rows of balls 5 and a cylindrical ball retainer 9. The ball screw outer race 3 is in turn supported by an array of balls 6 housed in a circular groove in the base 2. This array of balls 6 is only intended to support a vertical load, so there is built in radial clearance in the channel for the balls. Connected to the base 2 is a piston 10. Connected to the inner race 4 is a cylinder bore 12 with a close slip fit to the piston. These two parts form a chamber 11 that is connected to a vacuum source through an outlet line 8. They also radially constrain the chuck top 1 in the XY plane. Attached to the outer diameter of the outer race 3 is a pulley 7. It is intended that this pulley be belt driven by an adjacent motor and pulley. These parts are shown in FIG. 1.

When the outlet line 8 is connected to a vacuum source, the chuck top 1 is attracted to the base 2. Since the close fitting piston 10 and cylinder bore 12 provide a low leakage seal, the chamber 11 pressure can be readily controlled at a vacuum of 20° of mercury or better. This allows the resultant vertical chuck preload (F2) to be designed to a load value higher than the highest anticipated external load (F1).

By maintaining a proper ratio of cylinder and ball screw diameter to chuck diameter, the moment created by the overhanging external load will always be overcome by the vacuum preload acting about the closest supporting balls. Therefore the chuck top 1 will always be fully supported through the entire ball screw means 3, 4, 5 and lower array of balls 6 to the base 2. Under normal operation, no other means of support or constraint are necessary.

With the vacuum off, the chuck top 1 and ball screw assembly 3, 4, 5, 7 and 9 can readily be lifted off the base 2. To prevent this, multiple keeper brackets 13 can be attached to the base 2 after the main ball screw is assembled. These can overlap a flange on the pulley 7. Normally they are not in contact. The chuck top 1 and inner race 4 are prevented from rotating about the Z axis by an external slip joint or bearing 14.

For proper operation of the ball screw, the position of the balls and races must be initialized and maintained (see FIGS. 3 and 4). For a non-recirculating design, the balls are retained and separated by the retainer 9. Initialization is accomplished by first venting the chamber 11 to atmosphere and lowering the chuck top 1 to a Z=0 position. By providing a lower retainer stop 15 and an upper retainer stop 16 with a resulting distance between them (h2) slightly greater than the height of the ball retainer (h1), the retainer 9 may be initialized. Since the load on the ball screw is negligible with no vacuum preload or external load, the temporary skidding of the balls along the raceway grooves will not harm its future operation.

In operation, a tangential force is applied to the pulley 7 by an external belt. This results in a moment about the Z axis that turns the outer race 3 about the remaining assembly. Due to the matching helical grooves in both the outer race 3 and the inner race 4, the inner race and connecting parts are raised (or lowered) by the force transmitted through the array of balls 5 (see FIGS. 1 and 2 for views of the stage at the extremes of travel).

FIGS. 5A and 5B show cross-sectional and side views of a ball screw which forms a part of the invention of FIG. 1.

FIGS. 7A and 7B show cross-sectional and side views of the inner race portion 4 which forms a part of FIG. 1.

Figure 1:
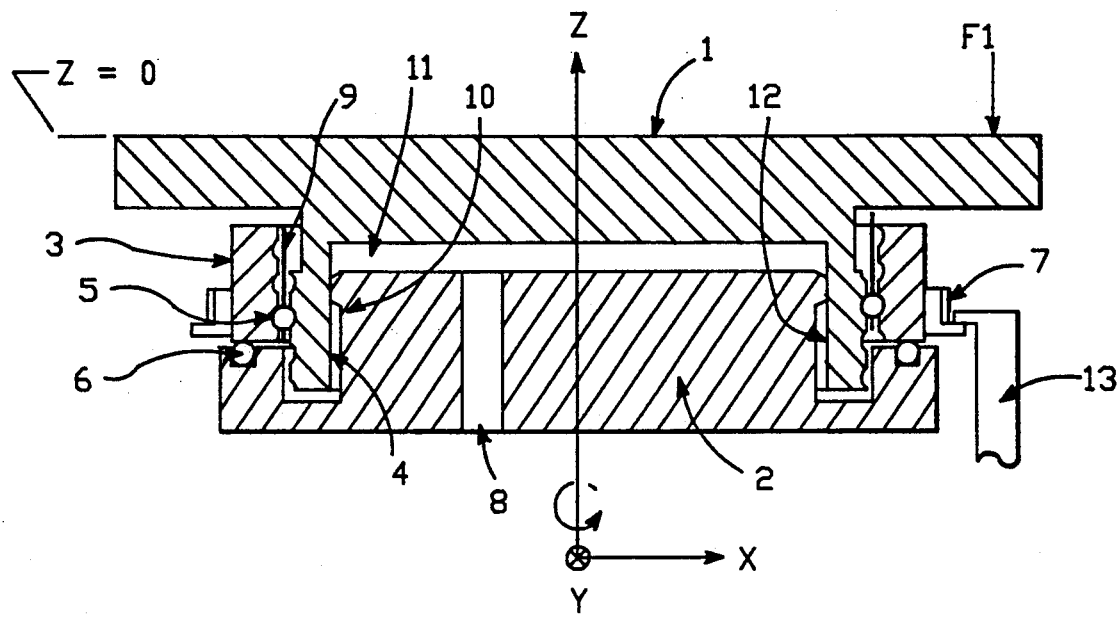
Figure 2:
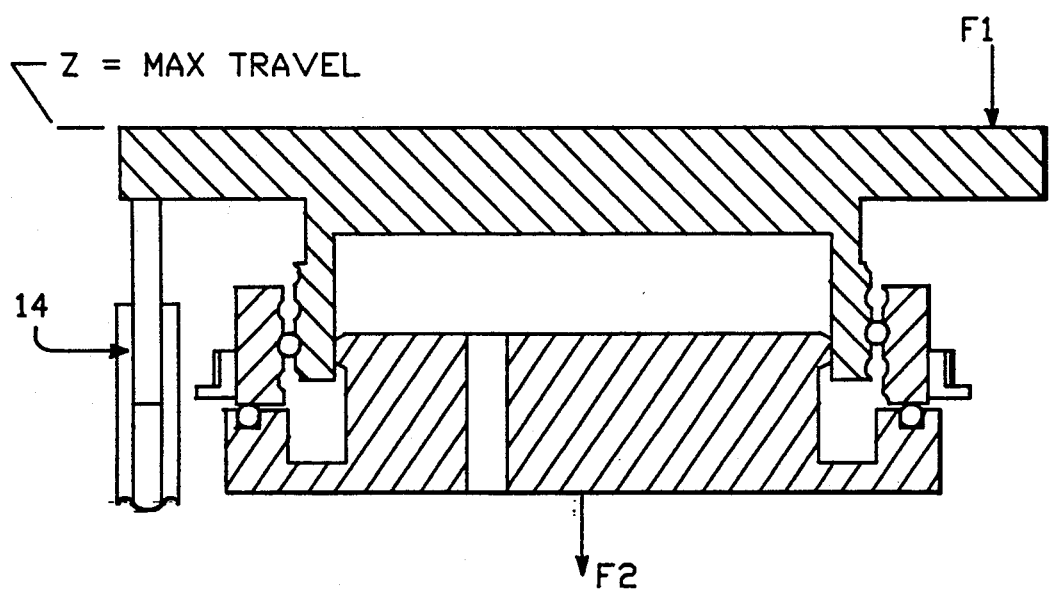
Figure 3:
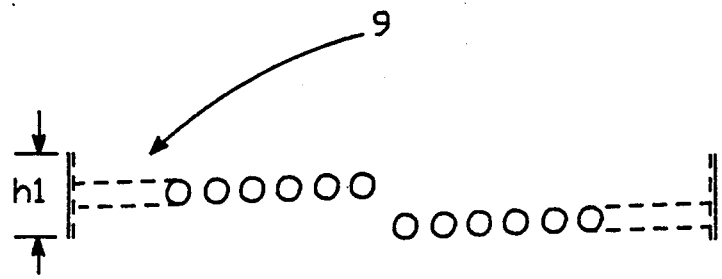
Figure 4:
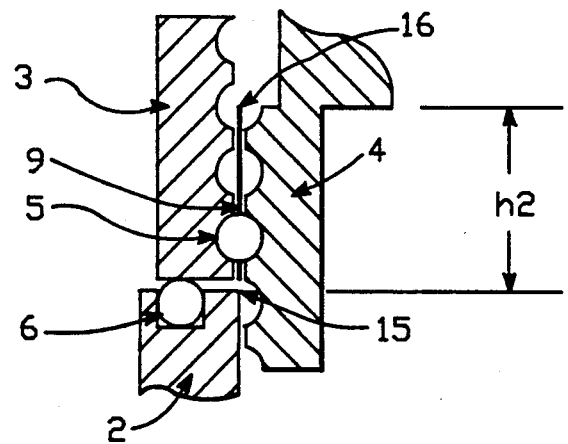
Figure 6B:
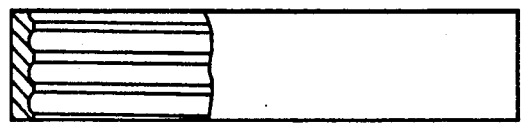
FIGS. 6A and 6B show cross-sectional and side views of the outer race portion 3 of FIG. 1.
Figure 6A:
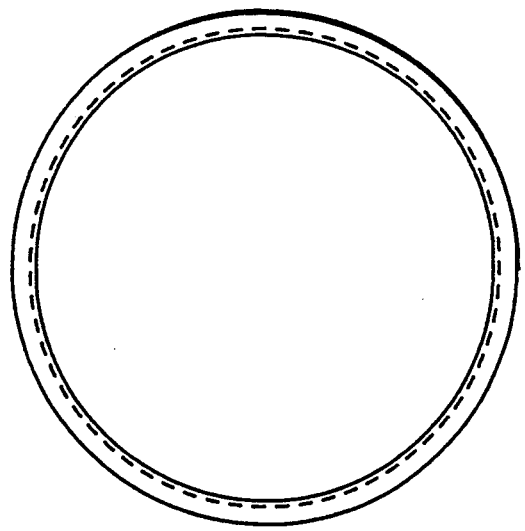

Construction of the ball screw device could be accomplished by using the standard technique of recirculating the balls, as they move down the raceway grooves. The problem with the recirculating concept is that the wall thickness required on the outer race is increased dramatically along with the weight of the device. Since this technique requires that a continuous line of balls be present, the total number of balls that are used is quite large. This creates friction problems. Also, the actual ball return paths compound the friction problem.

The vacuum preload technique could be replaced with a spring load, air cylinder load, or other remote loading device. The reason the vacuum technique is used is that it does not require any additional vertical space and can be integrated with the required XY constraint. Also, the preload can be easily reduced from a remote control position.

The ball screw according to the present invention supports the preload and external load about a large diameter foot print and thus achieves high cross axis torsional stiffness. All of the load is transmitted directly through the high contact angle ball bearings in compression. The only resultant deflection due to bending effects is within the work surface (or vacuum chuck). The minimum actual height required is only a function of the required travel and ball size. Very little extra height is required to implement the concept.

Another advantage is that the work surface (or vacuum chuck) can be made thinner and lighter than one which is supported on a smaller diameter sleeve bearing for equivalent bending stiffness. This is because the nearest attachment point is closer to externally applied loads at the periphery, and the resultant bending moment is less.

The utilization of a plane journal bearing for constraint of the stage in the XY plane eliminates any eccentricity errors of the actual ball screw and its attachment from being transmitted to the working surface. The main error transmitted will be a work surface wobble derived from any ball screw deviation.

What is claimed is:

1. In a wafer prober, a support stage comprising p1 a chuck top for supporting an external load, said chuck top adapted to be movable up and down with respect to the Z axis,
   ball screw means for supporting said chuck top wherein said balls crew means include an outer race and an inner race with corresponding matching helical grooves, one or more spiral rows of balls, a cylindrical ball retainer and an array of balls for supporting said outer race,
   a base for supporting said ball screw means,
   means for applying a vertical preload to said chuck top which is greater than said external load,
   said ball screw means including means for radially constraining said chuck top in the XY plane,
   said means for applying including a piston connected to said base, a cylinder bore connected to said inner race with a close slip fit to said piston so as to form a chamber, and means for applying a vacuum source to said chamber.

2. A support stage as in claim 1 wherein the diameter of said cylinder and ball screw means to said chuck diameter creates a moment which is always overcome by the preload acting upon the closest supporting balls.

3. A support stage as in claim 2 wherein said chuck top is always supported by said ball screw means and lower array of balls.

4. A support stage as in claim 3 including multiple keeper brackets attached to said base to prevent the lifting of said chuck top and ball screw means from said base.

5. A support stage as in claim 4 including an external slip joint or bearing to prevent said chuck top and inner race from being rotated about said Z axis.

6. A support stage as in claim 5 including means for initializing and maintaining the position of said balls and races.

7. A support stage as in claim 6 including means for venting said chamber to atmosphere and means for lowering the chuck top to a first position.

8. A support stage as in claim 7 including a lower retainer stop and an upper retainer stop with a resulting predetermined distance slightly greater than the height of the ball retainer.

9. A support stage as in claim 8 including means for applying a tangential force which results in a moment about the Z axis so as to turn said outer race about the remaining assembly.

* * * * *